(12) United States Patent
Lai et al.

(10) Patent No.: US 9,325,420 B2
(45) Date of Patent: Apr. 26, 2016

(54) ELECTRO-OPTICAL TRANSCEIVER DEVICE TO ENABLE CHIP-TO-CHIP INTERCONNECTION

(71) Applicant: QUALCOMM Incorporated, San Diego, CA (US)

(72) Inventors: Kwan-yu Lai, Campbell, CA (US); Ravindra Vaman Shenoy, Dublin, CA (US); Jitae Kim, Mountain View, CA (US); Jon Bradley Lasiter, Stockton, CA (US); Donald William Kidwell, Jr., Campbell, CA (US); Evgeni Petrovich Gousev, Saratoga, CA (US)

(73) Assignee: QUALCOMM Incorporated, San Diego, CA (US)

(*) Notice: Subject to any disclaimer, the term of this patent is extended or adjusted under 35 U.S.C. 154(b) by 30 days.

(21) Appl. No.: 14/280,270

(22) Filed: May 16, 2014

(65) Prior Publication Data

US 2015/0333831 A1 Nov. 19, 2015

(51) Int. Cl.
| | |
|---|---|
| H04B 10/00 | (2013.01) |
| H04B 10/50 | (2013.01) |
| G02B 6/43 | (2006.01) |
| G02B 6/42 | (2006.01) |
| H03F 3/08 | (2006.01) |
| G01J 1/04 | (2006.01) |
| G02B 6/00 | (2006.01) |

(52) U.S. Cl.
CPC ............... *H04B 10/50* (2013.01); *G01J 1/0407* (2013.01); *G02B 6/00* (2013.01); *G02B 6/428* (2013.01); *G02B 6/4212* (2013.01); *G02B 6/43* (2013.01); *H03F 3/08* (2013.01); *H04B 10/501* (2013.01)

(58) Field of Classification Search
CPC ........ H04B 10/12; H04B 10/14; H04B 10/80; H04B 10/801; H04B 10/802; G02B 6/4204; G02B 6/4214; G02B 6/4246; G02B 6/4249
See application file for complete search history.

(56) References Cited

U.S. PATENT DOCUMENTS

| | | | |
|---|---|---|---|
| 7,551,453 B2 | 6/2009 | Bozso et al. | |
| 8,231,284 B2 | 7/2012 | Doany et al. | |
| 2004/0136715 A1 | 7/2004 | Kondo | |
| 2009/0185808 A1* | 7/2009 | Kishima | G02B 6/43 398/118 |
| 2012/0141063 A1* | 6/2012 | Yamamoto | B29D 11/00663 385/14 |
| 2012/0163811 A1* | 6/2012 | Doany | H04B 10/40 398/41 |
| 2012/0189244 A1 | 7/2012 | Bowen et al. | |
| 2012/0251033 A1 | 10/2012 | Matsuoka et al. | |

OTHER PUBLICATIONS

Schares, Laurent et al., "Terabus: Terabit/Second-Class Card-Level Optical Interconnect Technologies," IEEE Journal of Selected Topics in Quantum Electronics, vol. 12, No. 5, Sep./Oct. 2006, pp. 1032-1044.

(Continued)

*Primary Examiner* — Daniel Dobson
(74) *Attorney, Agent, or Firm* — Toler Law Group, PC

(57) ABSTRACT

An apparatus includes a substrate and a waveguide coupled to a surface of the substrate. The surface forms a cladding layer of the waveguide. The apparatus includes a photodetector optically coupled to an end of the waveguide. The photodetector is configured to output an electrical signal responsive to receiving a light signal from a core of the waveguide. The apparatus also includes an amplifier device coupled to the substrate. The amplifier device is electrically coupled to the photodetector to amplify the electrical signal to produce an amplified electrical signal.

30 Claims, 6 Drawing Sheets

(56) References Cited

OTHER PUBLICATIONS

Schroder, Henning, "Chip-to-Chip Photonic Packaging by Using Thin Glass Based Waveguide Substrates on Board and Module Level," Fraunhofer IZM, Berlin, Germany, 2010, pp. 1-13.

Shiraishi, Takashi et al., "Cost-Effective Optical Transceiver Subassembly with Lens-integrated High-k, Low-Tg Glass for Optical Interconnection," IEEE Electronic Components and Technology Conference, 2011, pp. 798-804.

Suzuki, Atsushi et al., "Optoelectronic Substrate with High-Aspect-Ratio Optical Through-Hole for Chip-To-Chip Interconnects," 2011, 8 pages.

Takagi, Yutaka et al., "Optoelectronic Package Having Low-Loss Optical Waveguide Hole With Core-Clad Structure for Chip-to-Chip Interconnection," IEEE Photonics Technology Letters, vol. 20, No. 24, Dec. 15, 2008, pp. 2033-2035.

Chou, B.C., et al., "Modeling, Design, and Fabrication of Ultra-High Bandwidth 3D Glass Photonics (3DGP) in Glass Interposers," Electronic Components and Technology Conference (ECTC), 2013 IEEE 63rd, May 2013, IEEE, Piscataway, NJ, 286-291.

International Search Report and Written Opinion for International Application No. PCT/US2015/025522, ISA/EPO, Date of Mailing Oct. 6, 2015, 20 pages.

Schroder, H., et al., "GlassPack—A 3D Glass Based Interposer Concept for SiP with Integrated Optical Interconnects," Electronic Components and Technology Conference (ECTC), 2010 Proceedings 60th, Jun. 2010, IEEE, Piscataway, NJ, pp. 1647-1652.

Schroder, H., et al., "New Options for Chip-to Chip Phototonic Packaging by using Thin Glass Based Waveguide Substrates on Board and Module Level," Proceedings of SPIE, Feb. 2010, vol. 7607, SPIE, Bellingham, Washington, 10 pages.

Communication Relating to the Results of the Partial International Search for International Application No. PCT/US2015/025522, ISA/EPO, Date of Mailing Jul. 7, 2015, 6 pages.

* cited by examiner

ELECTRO-OPTICAL TRANSCEIVER DEVICE TO ENABLE CHIP-TO-CHIP INTERCONNECTION

FIELD

The present disclosure is generally related to an electro-optical transceiver device to enable chip-to-chip interconnection.

DESCRIPTION OF RELATED ART

An electronic device may include semiconductor devices (or semiconductor "chips") attached to a circuit board. For example, a mobile electronic device may include a processor and a memory attached to a circuit board. The semiconductor devices may communicate using connections, such as metal interconnects. To increase communication speed and/or quality, the semiconductor devices may be connected using optical (or electro-optical) interconnections. To illustrate, a semiconductor device may send data to and receive data from another semiconductor device by modulating data onto an optical signal and by transmitting the optical signal via an optical communication channel.

Assembling semiconductor devices on a circuit board to enable optical communication may be expensive and complicated. For example, a process to assemble semiconductor devices on a circuit board may include multiple assembly operations using a variety of materials (e.g., to form one or more lenses, waveguides, etc.). Further, the circuit board may be subject to multiple testing operations to verify the assembly process. As a result, some designers and manufacturers of electronic devices utilize electronic coupling (e.g., copper interconnects) to connect device components instead of using optical coupling. These electronic devices may have reduced performance (e.g., lower speed communications) as compared to electronic devices that include optically-coupled semiconductor chips.

SUMMARY

A device may include a substrate, such as a glass interposer. The substrate may be coupled to a printed circuit board (PCB) and further coupled to an optical channel (e.g., a waveguide) that communicates information between components (e.g., a processor and/or a memory) of the device. The substrate may have a configuration that integrates electro-optical functionalities and components. For example, the substrate may include one or more lens arrays, traces, waveguides, and/or electrical interconnects (i.e., one or more lens arrays, traces, waveguides, electrical interconnects, and/or other components may be integrated within the substrate). A waveguide may be coupled to a surface of the substrate. Alternatively or in addition, the substrate may include a waveguide (i.e., the waveguide may be integrated within the substrate). The substrate may enable reduced fabrication and assembly costs as compared to conventional electro-optical assembly processes (e.g., by reducing a number of assembly operations relative to conventional electro-optical assembly processes). For example, the substrate may enable a device manufacturer to avoid complex assembly of separate components such as silicon (Si) carriers, organic cutout substrates, and/or lens arrays. Further, by integrating components within the substrate, a size (or "form factor") of a device may be reduced as compared to a device assembled using a conventional assembly process.

In a particular embodiment, an apparatus includes a substrate and a waveguide coupled to a surface of the substrate. The surface forms a cladding layer of the waveguide. The apparatus includes a photodetector optically coupled to an end of the waveguide. The photodetector is configured to output an electrical signal responsive to receiving a light signal from a core of the waveguide. The apparatus also includes an amplifier device coupled to the substrate. The amplifier device is electrically coupled to the photodetector to amplify the electrical signal to produce an amplified electrical signal.

In another particular embodiment, a method includes applying a waveguide to a surface of a substrate of an electro-optical transceiver device. The surface forms a cladding layer of the waveguide. The method further includes optically coupling a light source to an end of the waveguide. The light source is configured to provide a light signal.

In another particular embodiment, an apparatus includes means for enabling electro-optical communications (e.g., a substrate) and means for guiding light. The means for guiding light is connected to a surface of the means for enabling electro-optical communications. The surface forms a cladding layer of the means for guiding light. The apparatus further includes means for applying a light signal to the means for guiding light and means for controlling the means for applying the light signal. The means for controlling is electrically coupled to the means for applying the light signal.

In another particular embodiment, a system includes a substrate and a light source array coupled to a surface of the substrate. The light source array is configured to direct light signals via multiple pathways through the substrate to transmit cores of a waveguide. The system further includes a via between a pair of adjacent pathways to reduce crosstalk of light signals between the pair of adjacent pathways. The system further includes a logic driver to control the light source array. The logic driver is coupled to the substrate and is electrically coupled to the light source array.

A particular advantage provided by at least one of the disclosed embodiments is that an electro-optical transceiver device that includes optical components on a substrate can be manufactured using fewer process operations. As an example, a waveguide of the electro-optical transceiver device and components of the electro-optical transceiver device may be coupled to the same substrate. Alternatively or in addition, the substrate may include a waveguide, which may reduce assembly costs associated with connecting devices to the waveguide. Further, a size (or "stack height") of the device can be reduced as compared to an electro-optical transceiver device that utilizes discrete components and metal interconnections (instead of a glass interposer). An electro-optical transceiver device in accordance with the present disclosure may enable higher bus throughput, fewer interconnect pins, less crowded logic to logic routing, and/or longer interconnects without deterioration in signal quality. Other aspects, advantages, and features of the present disclosure will become apparent after review of the entire application, including the following sections: Brief Description of the Drawings, Detailed Description, and the Claims.

DETAILED DESCRIPTION

Particular embodiments of devices that include an electro-optical transceiver device to enable chip-to-chip communication are presented in this disclosure. The chip-to-chip communication may be between chips coupled to a single circuit board or between a chip mounted on a first circuit board and a second chip mounted on a second circuit board. It should be appreciated, however, that the information described for particular embodiments with respect to the designs of devices may be embodied in a variety of contexts. The particular embodiments presented are merely illustrative and do not limit the scope of this disclosure.

The present disclosure describes particular embodiments in specific contexts. However, features, methods, structures or characteristics described according to the particular embodiments may also be combined in suitable manners to form one or more other embodiments. In addition, figures are used to illustrate the relative relationships between the features, methods, structures, or characteristics, and thus may not be drawn in scale. Directional terminology, such as "top," "bottom," "front," "back," etc. is used with reference to the orientation of the figures being described. As such, the directional terminology is used for purposes of illustration and is not meant to be limiting.

Figure 1:
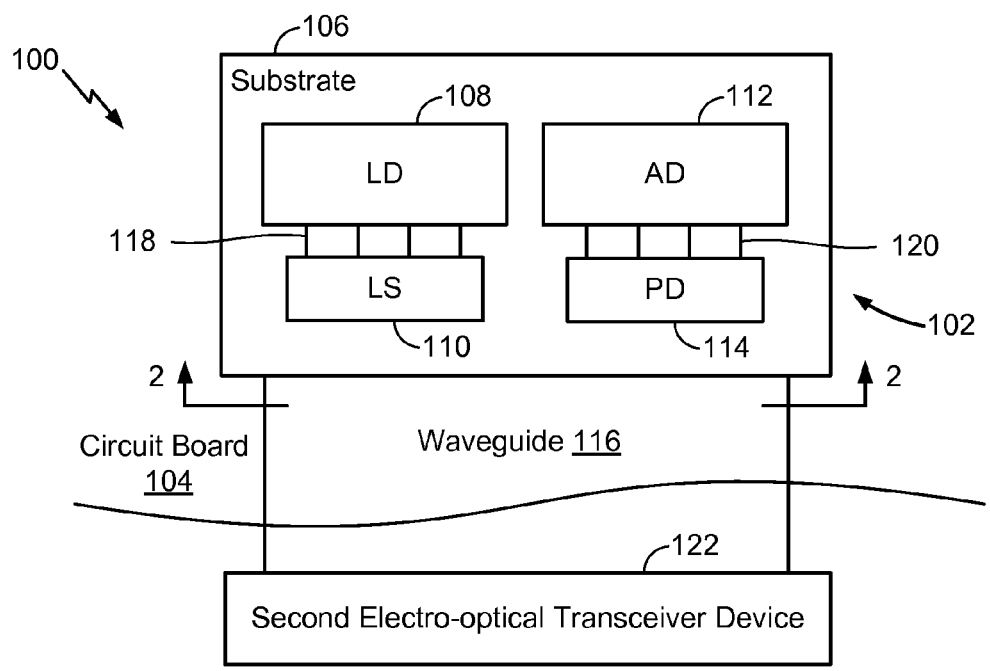
FIG. 1 is a top view representation of a particular illustrative embodiment of a device with an electro-optical transceiver device coupled to a circuit board.

FIG. 1 depicts a top view representation of a particular illustrative embodiment of a device 100 (e.g., an electro-optical device). The device 100 may include an electro-optical transceiver device 102 coupled to a circuit board 104. The electro-optical transceiver device 102 may include, or may be coupled to, a substrate 106 (e.g., a transparent or semi-transparent substrate, such as a glass interposer). The substrate 106 may integrate certain components associated with electro-optical communications. For example, the substrate 106 may include one or more interconnections, vias, optical devices, lenses or lens arrays, one or more other components, or a combination thereof.

The electro-optical transceiver device 102 may include a logic device (LD) 108, a light source (LS) 110, an amplifier device (AD) 112, and a photodetector (PD) 114. The LD 108, the LS 110, the AD 112, and the PD 114 may be attached to the substrate 106.

The LD 108 and the AD 112 may enable communication between devices that are attached to the circuit board 104. For example, the electro-optical transceiver device 102 may be accessed by a first device (e.g., a processor or a memory, as illustrative examples) that is attached to the circuit board 104. The first device may use the electro-optical transceiver device 102 to communicate information. For example, the first device may use the LD 108 and the LS 110 to send information (e.g., to a second device attached to the circuit board 104). As another example, the first device may use the AD 112 and the PD 114 to receive information (e.g., from the second device). The second device may use a second electro-optical transceiver device 122 to communicate with the first device. In a particular embodiment, components and operations of the second electro-optical transceiver device 122 may be as described with reference to the electro-optical transceiver device 102. Depending on the particular implementation, the second electro-optical transceiver device 122 may be coupled to the substrate 106, to another substrate, to the circuit board 104, or to another circuit board of the device 100.

In a particular embodiment, the circuit board 104 is an optical circuit board that includes a waveguide 116. Alternatively, the waveguide 116 may be distinct from the circuit board 104. The waveguide 116 may be coupled to an upper surface of the circuit board 104 or the waveguide 116 may be a portion of a sub-layer of the circuit board 104, as illustrative examples. The electro-optical transceiver device 102 may be coupled to the circuit board 104 at a first location of the circuit board 104, and the second electro-optical transceiver device 122 may be coupled to the circuit board 104 at a second location of the circuit board 104. The second electro-optical transceiver device 122 may be communicatively coupled to the electro-optical transceiver device 102 via the waveguide 116. In another embodiment, a second end of the waveguide 116 may be coupled to a second circuit board of the device 100. The second electro-optical transceiver device 122 may be coupled to the second circuit board and may be optically coupled to the second end of the waveguide.

In some embodiments, the electro-optical transceiver device 102 and the second electro-optical transceiver device 122 may each include one or more additional logic driver—light source pairs and/or one or more additional amplifier device—photodetector pairs coupled to the substrate 106 and optically coupled to the waveguide 116. In some embodiments, the electro-optical transceiver device 102 is communicatively coupled to an optical routing device via the waveguide 116. The optical routing device may include one or more optical switches, multiplexors, demultiplexors, or combinations thereof. The optical routing device may selectively route light signals to device components, as described further with reference to FIG. 9. The substrate 106 may include a transparent material (e.g., glass, quartz, etc.).

The substrate 106 may include one or more conductive vias through the substrate 106. The conductive vias may enable the LD 108 and the AD 112 to be electrically coupled to the circuit board 104 and/or to another device (e.g., a device located below the substrate 106 and not shown in FIG. 1). To further illustrate, the conductive vias may enable the LD 108 and the AD 112 to receive power from a power source connected to the circuit board 104.

The LD 108 may be a logic driver that controls the LS 110 so that the LS 110 sends light signals corresponding to data to the second electro-optical transceiver device 122. The LD 108 may receive data to be transmitted from one or more devices coupled to the circuit board 104 (e.g., from the first device that accesses the electro-optical transceiver device 102). For example, the LD 108 may cause the LS 110 to modulate light signals to represent data to be sent to the second electro-optical transceiver device 122. The light signals may be transmitted to the second electro-optical transceiver device 122 via the waveguide 116. As a non-limiting, illustrative example, a processor or a memory may use the LD 108 and the LS 110 to modulate light signals to represent data and/or instructions that are to be stored at the memory or that are to be used by the processor. Traces 118 on the substrate 106 may electrically couple the LD 108 to the light source LS 110 to enable the LD 108 to control the LS 110. For example, electrical signals generated by the LD 108 may be provided to the LS 110 via the traces 120, and the LS 110 may generate optical signals based on the electrical signals.

The LS 110 may include one or more light emitting diodes, laser diodes, lasers, and/or other light sources. In some embodiments, the LS 110 may be a vertical cavity surface emitting laser (VCSEL). The LS 110 may be controlled by the LD 108 to send light signals to the second electro-optical transceiver device 122. The LS 110 may include an array that is configured to transmit multiple light signals to the second electro-optical transceiver device 122 using multiple cores of the waveguide 116. The array may be a linear array or a two dimensional array of individual illumination sources, as illustrative examples.

The PD 114 may include a photodiode or other light detection device. The PD 114 may receive light signals from the second electro-optical transceiver device 122. The PD 114 may be configured to receive light signals via the waveguide 116 and to generate corresponding electrical signals (e.g., data) based on the received light signals. As an illustrative example, the PD 114 may include one or more photodiodes configured to generate electrical signals in response to received light signals, such as by generating an electrical signal having a magnitude, frequency, and/or phase corresponding to a received light signal. The PD 114 may provide the electrical signals to the AD 112. The PD 114 may include an array of photoreceptors configured to simultaneously receive a plurality of incoming light signals via multiple cores of the waveguide 116. The array may include a linear array of photoreceptors or a two dimensional array of photoreceptors, as illustrative examples.

The AD 112 may include an amplifier configured to amplify electrical signals corresponding to incoming light signals received by the PD 114 from the second electro-optical transceiver device 122 via the waveguide 116. The AD 112 may send the amplified electrical signals (e.g., to the first device) via the circuit board 104. Traces 120 on the substrate 106 may electrically couple the AD 112 to the PD 114. For example, electrical signals generated by the PD 114 may be provided to the AD 112 via the traces 120, and the AD 112 may amplify the electrical signals to generate amplified electrical signals.

The example of FIG. 1 illustrates improved electro-optical communication techniques. For example, the substrate 106 may reduce a number of assembly operations relative to conventional electro-optical assembly processes. To further illustrate, in the example of FIG. 1, the substrate 106 may integrate certain components such as one or more interconnections (e.g., the traces 118, 120), vias, optical devices, lenses (not shown in FIG. 1), one or more other components, or a combination thereof. Integrating such components within the substrate 106 may reduce a size (or "form factor") of the device 100 as compared to a device assembled using an assembly process that connects certain components "one-by-one."

To assemble the device 100, a portion (e.g., a block) of transparent material may be processed to form the substrate 106. For example, the portion may be processed (e.g., cut, polished, press molded, laser drilled, and/or etched, etc.) to include one or more integrated optical devices (e.g., lenses) and/or vias at particular locations of the portion of transparent material. The vias may be filled with material having certain conductive properties, optical properties, other properties, or combinations thereof. One or more redistribution layers may be deposited on the transparent material. Components of the electro-optical transceiver device 102 may be coupled to the one or more redistribution layers, the one or more conductive vias, or both, such as using a flip chip process. The flip chip process may enable alignment of electronic optical components (e.g., the LS 110 and the PD 114) with lenses formed in the transparent material so that resulting electro-optical transceivers are functional. In some embodiments, the LD 108 and the AD 112 for each electro-optical transceiver may be components of a single device (e.g., a system-on-chip device) instead of individual components.

The circuit board 104 may be fabricated with the waveguide 116 (e.g., the circuit board 104 may correspond to an optical circuit board, and the waveguide 116 may be integrated within the optical circuit board). Alternatively or in addition, a waveguide may be coupled to the circuit board 104 after fabrication of the circuit board 104. Alternatively or in addition, a waveguide may be coupled to or formed within the substrate 106, depending on the particular application (e.g., device form factor, assembly process, etc.) The electro-optical transceiver device 102 may be coupled to the circuit board 104 near a first end of the waveguide 116 (e.g., using a flip chip process) to align the electro-optical transceiver device 102 with the waveguide 116 and to electrically couple the electro-optical transceiver device 102 to the circuit board 104. The second electro-optical transceiver device 122 may be coupled to the circuit board 104 or to a second circuit board. The second electro-optical transceiver device 122 may be coupled to a second end of the waveguide (e.g., using a flip chip process) to align the second electro-optical transceiver device 122 with the waveguide 116, to electrically couple the second electro-optical transceiver device 122 to the circuit board 104 or the second circuit board, and to form the device 100.

Accordingly, use of the substrate 106 may simplify a process to assemble a device that uses electro-optical communications. In the example of FIG. 1, traces 118, 120 may be formed (e.g., "pre-fabricated") on the substrate 106. The traces 118, 120 may enable fewer process operations to assemble the device 100 as compared to a process that forms "customized" interconnections. Alternatively or in addition to the traces 118, 120, one or more other structures may be formed in a substrate. For example, one or more lenses may be formed in a substrate, as described further with reference to FIG. 2.

Figure 2:
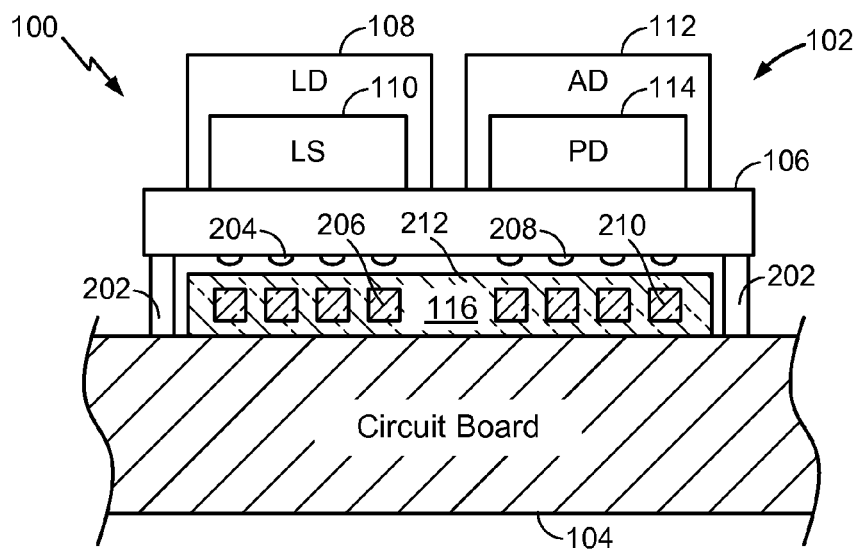
FIG. 2 is a cross-sectional representation taken substantially along cutting line 2-2 of FIG. 1 of a portion of an illustrative embodiment of an electro-optical transceiver device.

FIG. 2 depicts a cross-sectional view of the device 100 of FIG. 1 taken substantially along a plane indicated by cutting lines 2-2 of FIG. 1. The electro-optical transceiver device 102 may be coupled to the circuit board 104 by a plurality of connectors 202. The connectors 202 may physically support the electro-optical transceiver device 102, may electrically couple the electro-optical transceiver device 102 to the circuit board 104, or both.

In the example of FIG. 2, the waveguide 116 corresponds to a multi-core waveguide that includes multiple cores (e.g., multiple channels to independently and simultaneously transmit multiple optical signals between device components, such as the electro-optical transceiver devices 102, 122). The multiple cores may include one or more cores configured to receive outgoing optical signals from a device (or "outgoing cores," such as outgoing cores 206). The multiple cores may include one or more cores configured to receive incoming optical signals from the device (or "incoming cores," such as incoming cores 210).

The substrate 106 may include a lens configured to focus a light signal and to provide the light signal to a photoreceptor, such as a photoreceptor of the PD 114 of FIG. 1. To illustrate, the substrate 106 may include lenses 204. The lenses 204 may focus outgoing light signals that pass from the LS 110 through the substrate 106 to mirrors of the waveguide 116. The mirrors of the waveguide 116 may direct the outgoing light signals to the outgoing cores 206 of the waveguide 116. The substrate 106 may also include lenses 208. The lenses 208 may focus incoming light signals from the incoming cores 210 of the waveguide 116 to photoreceptors of the PD 114. The lenses 204 and 208 are depicted in FIG. 2 as extending from a bottom surface of the substrate 106. In other embodiments, the lenses 204 and 208 may be recessed in the substrate 106, may extend from the top surface of the substrate 106, may extend from the bottom surface of the substrate 106, or a combination thereof. For example, in at least one embodiment, the lenses 204 are recessed in the substrate 106 near a bottom surface of the substrate 106 and the lenses 208 are recessed in the substrate 106 near a top surface of the substrate 106.

The waveguide 116 may be coupled to the circuit board 104. The waveguide 116 may include the outgoing cores 206 beneath the LS 110 for outgoing light signals from the LD 108, the incoming cores 210 beneath the PD 114 for incoming light signals, and cladding 212. The cladding 212 may enable reflection (e.g., total internal reflection) of outgoing light signals passing through the outgoing cores 206 and may further enable reflection of incoming light signals passing through the incoming cores 210. The waveguide 116 may include a mirror positioned at an end of each outgoing core 206. The mirror for a particular outgoing core may change a direction of an outgoing light signal passing through the substrate 106 from the LS 110 associated with the particular outgoing core so that the outgoing light signal enters the particular outgoing core. The waveguide 116 may also include a mirror positioned at an end of each incoming core 210. The mirror for a particular incoming core may change a direction of an incoming light signal that exits the particular incoming core so the incoming light signal is directed through the substrate 106 to a particular photoreceptor of the PD 114 that corresponds to the particular incoming core.

The example of FIG. 2 illustrates that a substrate (e.g., the substrate 106) may include one or more lenses (e.g., the lenses 204, 208) to focus optical signals sent and received via a waveguide, such as the waveguide 116. The lenses 204, 208 may improve quality of optical communications by increasing resolution of optical signals (e.g., to reduce distortions caused by light refraction, etc.). Thus, the substrate 106 may enable high quality of optical communications while also reducing assembly costs of devices (e.g., because lenses 204, 208 may be included in the substrate 106 rather than being assembled "one-by-one"). Alternatively or in addition, a substrate may include a redistribution layer and/or a via, as described further with reference to FIG. 3.

Figure 3:
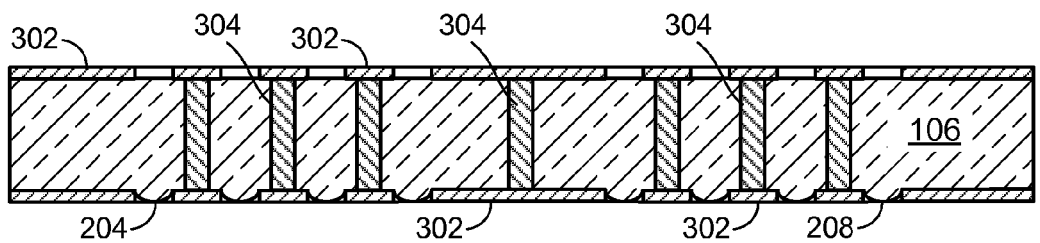
FIG. 3 is a cross-sectional representation of a particular illustrative embodiment of a substrate of FIG. 1 taken substantially along a cutting line passing through a shared center line of lenses of the substrate.

FIG. 3 depicts a cross-sectional view of the substrate 106 depicted in FIG. 1 taken substantially along a cutting plane passing through a shared center line of the lenses 204, 208. The substrate 106 may include one or more redistribution layers 302 (e.g., metal redistribution layers) sputtered or otherwise deposited on the substrate 106 to enable electrical connections among devices coupled to the substrate 106. The redistribution layers 302 may selectively "block" extraneous optical signals in order to improve quality of transmitted optical signals. For example, portions of the one or more redistribution layers 302 adjacent to entrances to optical pathways for outgoing light signals may inhibit passage of undesired light into the optical pathways. As another example, portions of the redistribution layers 302 adjacent to entrances to optical pathways for incoming light signals may inhibit passage of undesired light into the optical pathways.

The substrate 106 may also include filled vias 304 between adjacent optical pathways of the substrate 106. Depending on the particular implementation, electrical signals or light signals may be sent and received (e.g., by the electro-optical transceiver device 102 of FIG. 1) using the filled vias 304. The filled vias 304 may reduce (or inhibit) crosstalk of light between neighboring optical pathways.

In some embodiments, a device may include an electro-optical transceiver device pair coupled to opposite sides of a substrate. The electro-optical transceivers of the electro-optical transceiver pair may be optically coupled by one or more waveguides connected to or formed within the substrate. The waveguide may be a polymer waveguide. The waveguide may include silicon/silicon dioxide thin films that are deposited on the substrate. The optical properties of cores of the waveguide and optical properties of the substrate may be chosen so that the substrate forms a cladding layer of the waveguide to enable internal reflection of light signals within the cores. In some embodiments, the electro-optical transceiver device may be about 1 cm to about 10 cm in length. In other embodiments, electro-optical transceiver devices may have shorter or longer lengths. The electro-optical transceiver device may be coupled to a single circuit board or to a pair of circuit boards.

Optical alignment of optical components of the electro-optical transceiver device may be simplified using the techniques illustrated with reference to FIG. 3. For example, optical alignment may be achieved during device assembly by aligning components with a common device (such as the substrate 106), which may reduce a number of optical alignments during the assembly process. In certain embodiments, a substrate includes a waveguide, and a circuit board may be less expensive to produce since the circuit board is not required to include a waveguide. In some embodiments, the optical components (e.g., the light source and the photodetector) may be located directly on the waveguide. Positioning the optical components directly on the waveguide may reduce or eliminate the need for the substrate to be transparent and the need for the substrate to have integrated optics (e.g., lenses). In these cases, optical signals are not transmitted through the substrate. In other embodiments, optical signals are transmitted through a substrate, such as through a lens of the substrate. To illustrate, optical components (e.g., a light source and a photodetector) of an electro-optical transceiver device may be coupled to a first side of a transparent substrate and optical signals may pass through the transparent substrate. The optical signals may pass through the transparent substrate to a waveguide formed on a second side of the transparent substrate.

Figure 4:
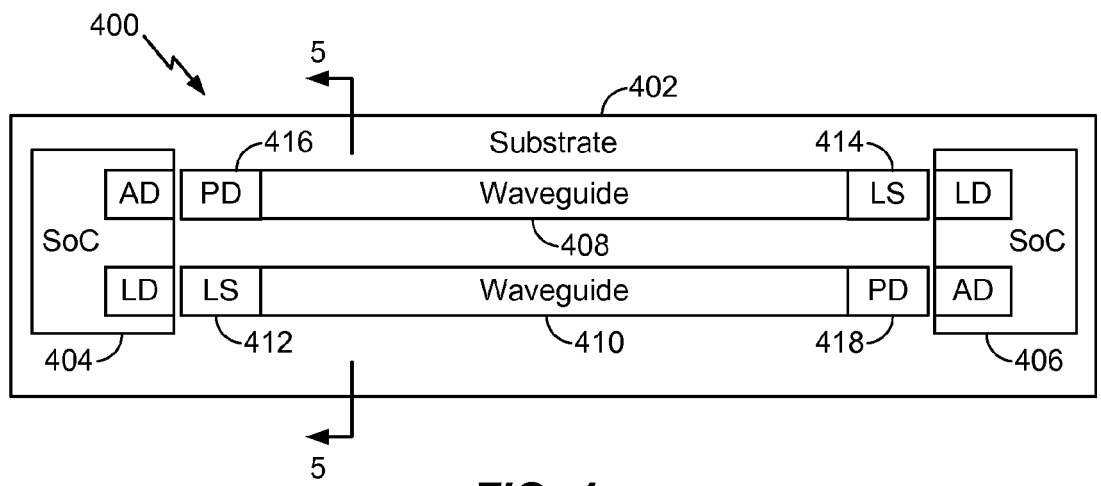
FIG. 4 depicts a top view representation of a particular illustrative embodiment of an electro-optical transceiver device.

FIG. 4 depicts a top view representation of a particular illustrative embodiment of an electro-optical transceiver device 400. The electro-optical transceiver device 400 includes a substrate 402; a system-on-chip (SoC) 404; a SoC 406; waveguides 408, 410; light sources 412, 414; and photodetectors 416, 418. Each SoC 404, 406 may include a logic driver (LD) portion and an amplifier device (AD) portion. In alternate embodiments, logic drivers and amplifier devices may be external to the SoCs 404, 406.

The LD portion of the SoC 404 may be electrically coupled to the light source 412 to control the light source 412 so that one or more illumination sources of the light source 412 send first light signals through one or more cores of the waveguide 410 to one or more photoreceptors of photodetector 418. The first light signals may correspond to data received by the SoC 404 from one or more first devices electrically coupled to the SoC 404 via a circuit board that is electrically coupled to the electro-optical transceiver device 400. Each illumination source of the light source 412 may be optically coupled to an individual core of the waveguide 410. The individual core may also be optically coupled to an individual receptor of the photodetector 418. The photodetector 418 may send electrical signals corresponding to the first light signals to the AD portion of the SoC 406. The AD portion may amplify the electrical signals and send amplified electrical signals corresponding to the first light signals to one or more second devices electrically coupled to the SoC 406 via the circuit board.

The LD portion of the SoC 406 may be electrically coupled to the light source 414 to control the light source 414 so that one or more illumination sources of the light source 414 send second light signals through one or more cores of the waveguide 408 to one or more photoreceptors of photodetector 416. The second light signals may correspond to data received by the SoC 406 from one or more third devices electrically coupled to the SoC 406 via the circuit board that is electrically coupled to the electro-optical transceiver device 400. Each illumination source of the light source 414 may be optically coupled to an individual core of the waveguide 408. The individual core may also be optically coupled to an individual receptor of the photodetector 416. The photodetector 416 may send electrical signals corresponding to the second light signals to the AD portion of the SoC 404. The AD portion of the SoC 404 may amplify the electrical signals and send amplified electrical signals corresponding to the second light signals to one or more fourth devices electrically coupled to the SoC 404 via the circuit board.

FIG. 4 illustrates electro-optical communication for multiple devices, such as the SoCs 404, 406. By integrating LDs and ADs within the SoCs 404, 406, assembly operations are reduced. For example, the SoCs 404, 406 may be directly coupled to the LSs 412, 414 and to the PDs 416, 418 (instead of separately coupling each SoC to an AD and then coupling the AD to a PD, etc.).

Figure 5:
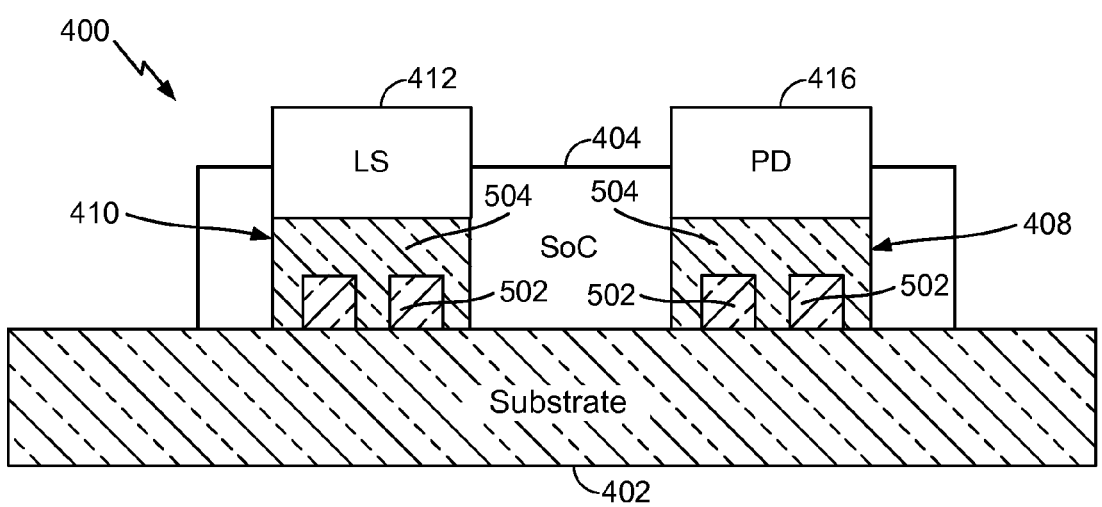
FIG. 5 is a cross-sectional representation taken substantially along cutting line 5-5 of FIG. 4 that shows a cross section of optical waveguides of the electro-optical transceiver device.

FIG. 5 depicts a cross-sectional representation of the electro-optical transceiver device 400 taken substantially along cutting line 5-5 of FIG. 4 to show a cross section of the waveguides 408, 410. Each waveguide 408, 410 may include cores 502 and a cladding layer 504. A second cladding layer for each of the cores 502 may be the substrate 402. Each waveguide 408, 410 is depicted as having two cores 502. The cores 502 of the waveguide 408 are associated with individual photoreceptors of the photodetector 416. The cores 502 of the waveguide 410 may be responsive to corresponding illumination sources of the light source 412. In other embodiments, the waveguides 408, 410 may have fewer or more than two cores 502, and the light source 412 and the photoreceptor 416 may have a corresponding number of illumination sources and photoreceptors, respectively.

FIG. 5 illustrates that a substrate (e.g., the substrate 402) may be used to reduce complexity of device assembly operations. For example, the substrate 402 may be specifically designed to support particular components of the electro-optical transceiver device 400 (e.g., the substrate 402 may have particular dimensions selected based on the particular components). Therefore, because components of the electro-optical transceiver device 400 may be assembled on a common surface or substrate, an assembly process is simplified as compared to a process that positions devices on multiple different circuit boards, optical circuit boards, flex-polymer surfaces, carriers, etc.

Figure 6:
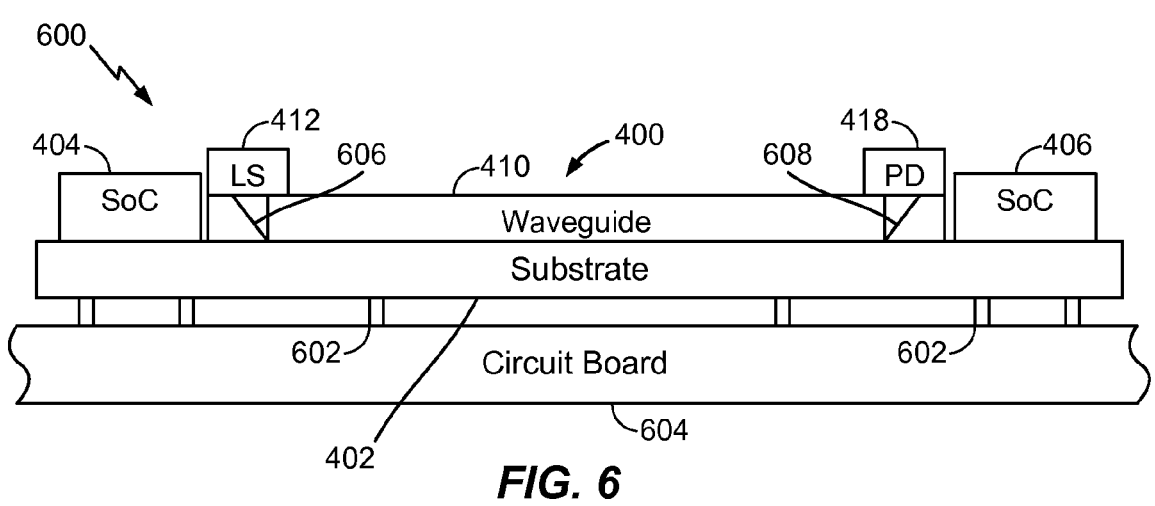
FIG. 6 is a front view representation of a device including the electro-optical transceiver device depicted in FIG. 4.

FIG. 6 depicts a front view representation of a particular illustrative embodiment of a device 600 that includes the electro-optical transceiver device 400 of FIG. 4. The electro-optical transceiver device 400 may be coupled by connectors 602 to a circuit board 604. The connectors 602 may electrically couple the circuit board 604 to the electro-optical transceiver device 400 and/or may support the electro-optical transceiver device 400. One or more conductive vias through the substrate 402 may enable the circuit board 604 to be electrically coupled to components of the electro-optical transceiver device 400 so that the components of the electro-optical transceiver device 400 may receive power, may receive data from one or more devices coupled to the circuit board 604, may send data to one or more devices coupled to the circuit board 604, or combinations thereof.

The waveguide 410 of the electro-optical transceiver device 400 may include a first mirror 606 to direct the first light signals from the light source 412 to one or more cores of the waveguide 410. The waveguide 410 may also include a second mirror 608 to direct the first light signals from the waveguide 410 to the photodetector 418.

To form the device 600, a block of material used to form the substrate 402 may be processed (e.g., cut, polished, laser drilled, etched, etc.) to form a wafer with vias at desired locations. Because light signals do not pass through the substrate 402, the material may not be transparent. The material of the substrate 402 may be, but is not limited to, glass, a quartz, silicon-on-insulator (SOI), a silicon-on-sapphire (SOS), gallium arsenide (GaAs), indium phosphide (InP), silicon carbide (SiC), aluminum nitride (AlN), rogers laminate, a polymer material, or combinations thereof. One or more of the vias may be filled with conductive material to form conductive vias that enable the electro-optical transceiver device 400 to be coupled to one or more circuit boards or other devices. The conductive vias may also enable the electro-optical transceiver device 400 to receive power, to receive first data, and to send second data corresponding to the first data to a destination device. One or more redistribution layers may be deposited on the material. Waveguides may be formed such that the material forms a cladding layer for the waveguides. One or more redistribution layers may be coupled to the waveguides. Components 404, 406 and 412-418 may be coupled to the waveguides and the material by a flip chip process. The flip chip process may align optical components (i.e., the waveguides 408, 410; the light sources 412, 414; and the photodetectors 416, 418) so that the optical components are functional.

FIG. 6 depicts components of the electro-optical transceiver device 400 coupled to a first surface of the substrate 402 that is farthest away from the circuit board 604. Additional devices (e.g., other electro-optical transceiver pairs that are communicatively coupled together) may be coupled to a second surface of the substrate 402 that is closest to the circuit board, may be coupled to the first surface, or both. Alternately, the components of one or more electro-optical transceiver devices 400 may be coupled to the second side of the substrate 402 that is closest to the circuit board 604. The first side of the substrate 402 may include no devices or additional devices.

The example of FIG. 6 illustrates that a substrate may be utilized to improve assembly flow. For example, components may be attached to the substrate 402, and the substrate 402 may be attached to the circuit board 604 (e.g., using the connectors 602). Thus, use of an optical circuit board to support optical components may be avoided by instead using the substrate 402. A substrate may be less expensive than an optical circuit board in certain applications.

Figure 7:
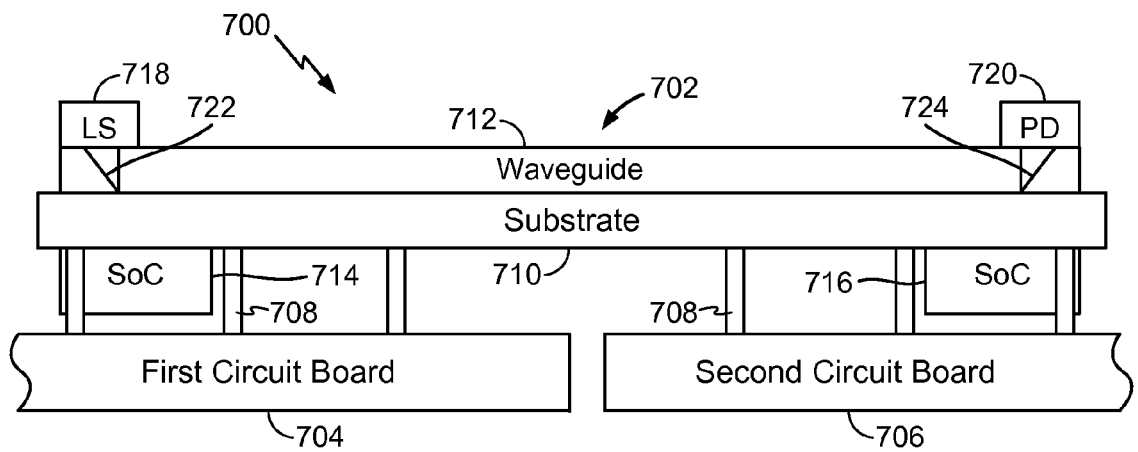
FIG. 7 is a front view representation of a particular illustrative embodiment of a device including an electro-optical transceiver device coupled to a circuit boards.

FIG. 7 depicts a front view representation of a particular illustrative embodiment of a device 700 that includes an electro-optical transceiver device 702. The electro-optical transceiver device 702 may be coupled to a first circuit board 704 and a second circuit board 706 by connectors 708.

The electro-optical transceiver device 702 may include a substrate 710 with a waveguide 712 coupled to a first surface of the substrate 710 and SoCs 714, 716 coupled to a second surface of the substrate 710. Each SoC 714, 716 may include a logic device to control an electrically coupled light source (e.g., a first light source 718 electrically coupled to the SoC 714) and an amplifier device to receive and amplify electrical signals corresponding to light signals received by an electrically coupled photodetector (e.g., a second photodetector 720 electrically coupled to the SoC 716). In alternate embodiments, separate logic devices and amplifier devices may be utilized instead of the SoCs 714, 716.

The first light source 718 and a first photodetector may be optically coupled to a first end of the waveguide 712. A second light source and the second photodetector 720 may be coupled to a second end of the waveguide 712. The first light source 718 and the first photodetector may be electrically coupled to the SoC 714 by one or more conductive vias that extend through the substrate 710, the waveguide 712, or both. The second light source and the second photodetector 720 may be electrically coupled to the SoC 716 by one or more conductive vias that extend through the substrate 710, the waveguide 712, or both.

The first light source 718 may be controlled by the logic driver of the SoC 714 to send first light signals to the second photodetector 720 via one or more first cores of the waveguide 712. A particular first light signal from the first light source 718 may be directed by a mirror 722 to a first core. The first light signals exiting the one or more first cores may be directed to the photodetector 720. For example, the particular first light signal exiting the first core may be directed by a mirror 724 to the second photodetector 720. The first light signals may correspond to data received by the SoC 714 from one or more devices coupled to the first circuit board 704. The second photodetector 720 may convert the first light signals to electrical signals that are sent to the amplifier device of the SoC 716. The amplifier device of the SoC 716 may amplify the electrical signals from the second photodetector 720 and send amplified signals corresponding to the first light signals to a destination device on the second circuit board 706.

In a similar manner, the SoC 716 may control the second light source to send second light signals to the first photodetector via one or more second cores of the waveguide 712. The second light signals may correspond to second data received by the SoC 716 from one or more device coupled to the first circuit board 704. The first photodetector may send electrical signals corresponding to the second light signals to the SoC 714. The SoC 714 may amplify the electrical signals and send amplified electrical signals to one or more devices coupled to the second circuit board 706.

FIG. 7 illustrates that connectors may be used to couple a substrate to multiple circuit boards. For example, the connectors 708 depicted in FIG. 7 enable the waveguide 712 to be positioned on a first side of the substrate 710 farthest away from the circuit boards 704, 706. In other embodiments, the connectors 708 may be positioned to enable the waveguide 712 to be positioned on a second side of the substrate closest to the circuit boards 704, 706 with the SoCs 714, 716 positioned on the first side of the substrate farthest away from the circuit boards 704, 706.

Figure 8:
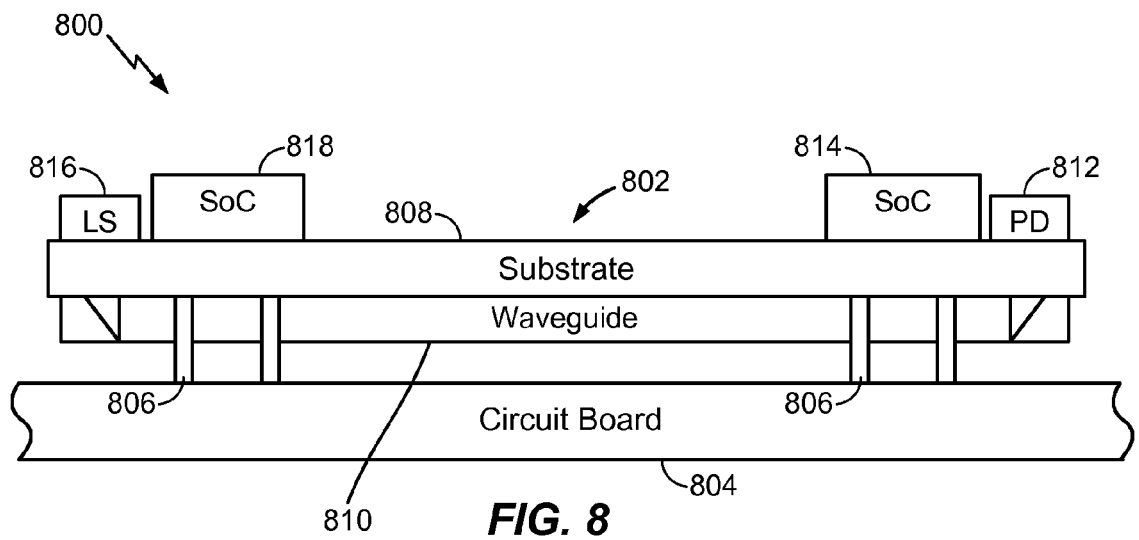
FIG. 8 is a front view representation of a particular illustrative embodiment of a device including an electro-optical transceiver device coupled to a circuit board.

FIG. 8 depicts a front view representation of a particular illustrative embodiment of a device 800 that includes an electro-optical transceiver device 802. The electro-optical transceiver device 802 may be coupled to a circuit board 804 by connectors 806.

The electro-optical transceiver device 802 may include a substrate 808 with a waveguide 810 coupled to a first surface of the substrate 808. The electro-optical transceiver device 802 may include a first photodetector 812, a first light source, a SoC 814, a second photodetector, a second light source 816, and a SoC 818 each coupled to a second surface of the substrate 808 opposite the first surface. The SoC 814 may be electrically coupled to the first photodetector 812 and the first light source. The SoC 814 may be coupled to the circuit board 804 by one or more conductive vias through the substrate 808 and by the connectors 806. Similarly, the SoC 818 may be electrically coupled to the second photodetector and the second light source 816. The SoC 818 may be coupled to the circuit board 804 by one or more conductive vias through the substrate 808 and by the connectors 806. Each SoC 814, 818 may include a logic device portion to control an electrically coupled source (e.g., the second light source 816 electrically coupled to the SoC 818) and an amplifier device portion to receive and amplify electrical signals corresponding to light signals received by an electrically coupled photodetector (e.g., the first photodetector 812 electrically coupled to the SoC 814). In alternate embodiments, separate logic devices and amplifier devices may be utilized instead of the SoCs 814, 818.

The substrate 808 may include integrated lenses. The lenses may be convex lens, may be concave lens, may be recessed in the substrate 808, may extend from the first surface of the substrate 808, may extend from the second surface of substrate 808, or may include combinations thereof. The substrate 808 may include one or more filled vias through the substrate 808 between optical signal pathways through the substrate 808 as light signal crosstalk limiting structures. The substrate 808 may also include one or more light collimating features integrated in the substrate 808. When the waveguide 810 is coupled to the substrate 808, mirrors 820 of the waveguide 810 that reflect light signals to photodetectors (e.g., the first photodetector 812) or reflect light signals from light sources (e.g., the second light source 816) to cores of the waveguide 810 are aligned with the lenses of the substrate 808. The photodetectors and the light sources may be coupled to the substrate 808 using a flip chip process so that the photodetectors and light sources are aligned with corresponding mirrors of the waveguide 810.

The second light source 816 may be controlled by the logic driver of the SoC 818 to send first light signals to the first photodetector 812 via one or more cores of the waveguide 810. The first light signals may correspond to data received by the SoC 818 from one or more devices coupled to the circuit board 804. The first light signals from the light source 816 may pass through the substrate 808 to one or more first mirrors that direct the first light signals to the one or more cores of the waveguide 810. The first light signals may pass through the one or more cores of the waveguide 810 to one or more second mirrors that direct the first light signals through the substrate 808 to the first photodetector 812. The first photodetector 812 may convert the first light signals to electrical signals that are sent to the amplifier device of the SoC 814. The amplifier device of the SoC 814 may amplify the electrical signals from the first photodetector 812 and send amplified signals corresponding to the first light signals to a destination device on the circuit board 804.

In a similar manner, the SoC 814 may control the first light source to send second light signals to the second photodetector via one or more second cores of the waveguide 810. The second light signals may correspond to second data received by the SoC 814 from one or more devices coupled to the circuit board 804. The second photodetector may send electrical signals corresponding to the second light signals to the SoC 818. The SoC 818 may amplify the electrical signals and send amplified electrical signals to one or more devices coupled to the circuit board 804.

FIG. 8 illustrates techniques for enable electro-optical communications between devices, such as the SoCs 814, 818, using a substrate, such as the substrate 808. Electro-optical communications may increase data transfer speed as compared to electrical communications, thus improving performance of the device 800.

Figure 9:
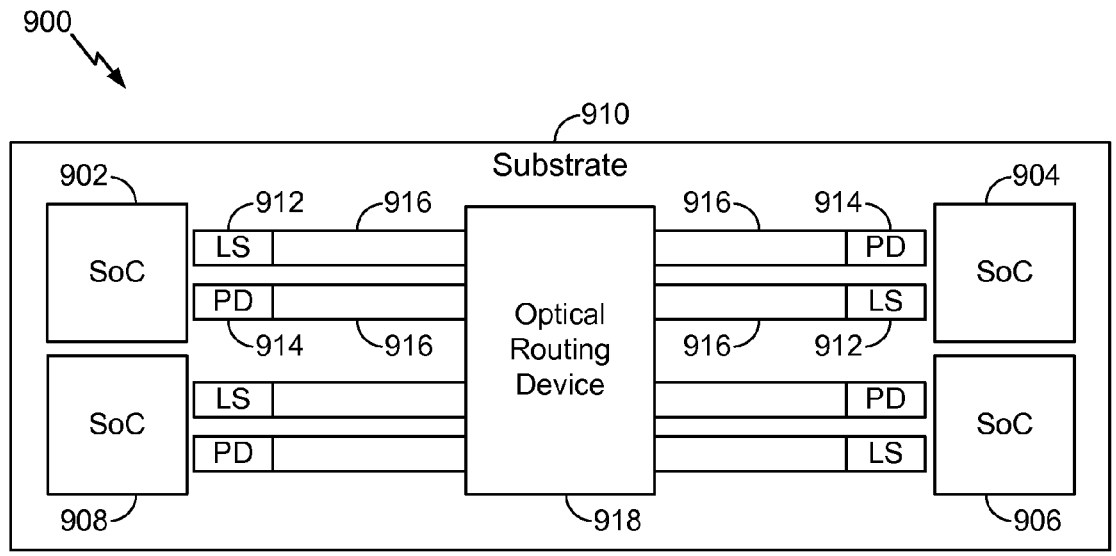
FIG. 9 is a top view representation of a particular illustrative embodiment of an electro-optical transceiver device including an optical routing device.

FIG. 9 depicts a top view representation of a particular illustrative embodiment of an electro-optical transceiver device 900. The electro-optical transceiver device 900 includes a plurality of SoCs 902-908 coupled to a first surface of a substrate 910. In alternate embodiments, separate logic devices and amplifier devices may be utilized instead of one or more of the SoCs 902-908. The substrate 910 may include a first plurality of conductive vias through the substrate from the first surface to a second surface of the substrate 910 to enable the SoCs 902-908 to be electrically coupled to at least one circuit board. Each SoCs 902-908 may include a logic driver portion to control an electrically coupled light source and an amplifier device portion to receive electrical signals that correspond to light signals received at an electrically coupled photodetector. Each SoC 902-908 may be electrically coupled to an adjacent optical device pair. Each optical device pair may include a light source 912 and a photodetector 914. Each optical device pair may be optically coupled to first ends of a pair of waveguides 916. In alternate embodiments, separate logic devices and amplifier devices may be utilized instead of one or more of the SoCs 902-908. In alternate embodiments, a single waveguides may replace a pair of waveguides 916.

Second ends of the waveguides 916 are optically coupled to an optical routing device 918 that is coupled to the substrate 910. The optical routing device 918 may be an optical switch, a multiplexor, a demultiplexor, a modulator, or combinations thereof. In some embodiments, one or more optic fibers may be coupled to the optical routing device 918 to enable the optical routing device 918 to receive incoming optical signals from an external source, to enable the optical routing device 918 to send outgoing optical signals to the external source, or both. The substrate 910 may include at least one second conductive via through the substrate 910 from the first surface to the second surface to enable the optical routing device 918 to be electrically coupled to at the least one circuit board.

Each SoC 902-908 may be capable of receiving data and sending the data via an electrically coupled light source as a light signal to the optical routing device 918. The optical routing device 918 may process received light signals and send a processed signal based on the light signal to a destination device. For example, the SoC 902 may receive first data from a circuit board electrically coupled to the SoC 902. The logic driver of the SoC 902 may control the light source 912 electrically coupled to the SoC 902 to send a first light signal corresponding to the data to the optical routing device 918 via the waveguide 916 optically coupled to the light source 912. The optical routing device 918 may receive the first light signal from the SoC 902 and a second light signal corresponding to second data from the SoC 908. The optical routing device 918 may multiplex the first light signal and the second light signal to a third light signal that is sent via the waveguide 916 coupled to the photodetector 914 associated with the SoC 904.

To form the electro-optical transceiver device 900, a block of material used to form the substrate 910 may be processed (e.g., cut, polished, laser drilled, etc.) to form a wafer with vias at desired locations. Because light signals do not pass through the substrate 910, the material may not be transparent. One or more of the vias may be filled with conductive material to form conductive vias that enable the electro-optical transceiver device 900 to be coupled to at least one circuit board or other device. The conductive vias may also enable the electro-optical transceiver device 900 to receive power, to receive first data, and to send second data corresponding to the first data to a destination device. One or more redistribution layers may be deposited on the material. Waveguides 916 may be formed such that the material forms a cladding layer for the waveguides 916. Components 902-908, 912, 914, and 918 may be coupled to the waveguides 916 and the material by a flip chip process. The flip chip process may align optical components (i.e., the waveguides 408, 410; the light sources 912, the photodetectors 914, and the optical routing device 918) so that the optical components are functional.

FIG. 9 illustrates techniques for enabling electro-optical communications for multiple devices, such as the SoCs 902, 904, 906, and 908. For example, the optical routing device 918 may selectively route optical signals to the SoCs 902, 904, 906, and 908, which may provide faster data transfer as compared to conventional electrical connections (e.g., copper interconnections).

Figure 10:
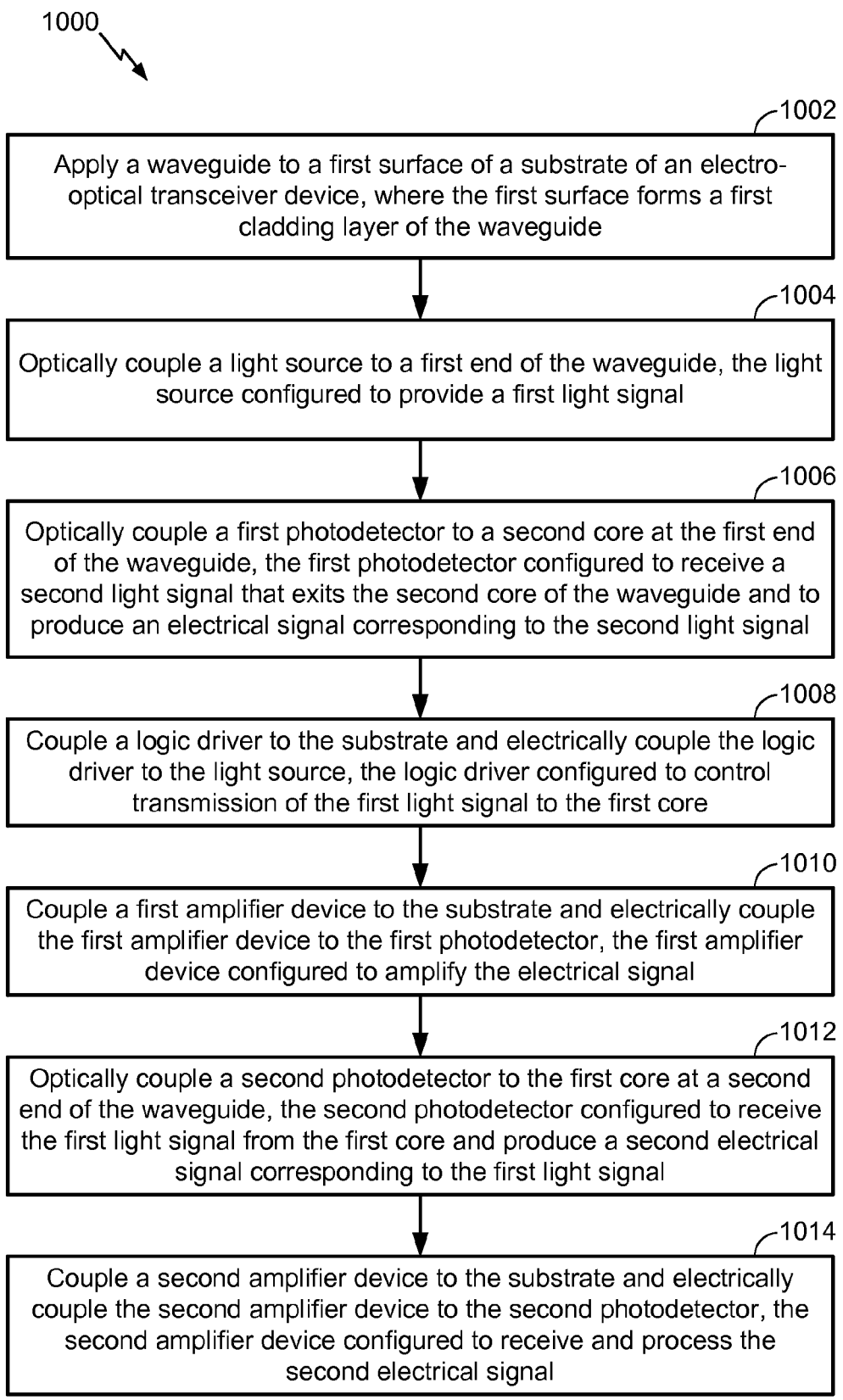
FIG. 10 is a flow chart of a particular illustrative embodiment of a method of forming an electro-optical transceiver device.

Referring to FIG. 10, a flow chart of a particular illustrative embodiment of a method of forming an electro-optical transceiver device to enable chip-to-chip interconnection is depicted and generally designated 1000. The electro-optical transceiver device may be any of the devices 400, 702, 802, 900 of FIGS. 4-9.

The method 1000 includes applying a waveguide to a first surface of a substrate of an electro-optical transceiver device, at 1002. In an embodiment, applying the waveguide may include depositing cores of the waveguide on the substrate. The first surface of the substrate forms a cladding layer of the waveguide. An additional cladding layer may be deposited on the cores to encase the cores in cladding. Mirrors of the waveguide may be deposited in working relation to the cores to direct light signals from light sources into the cores and to direct the light signals exiting the cores to photodetectors. Cladding layers around the cores may enable internal reflection of light signals in the cores. In another embodiment, a preformed waveguide may be bonded to the first surface of the substrate so that the first surface of the substrate is the first cladding layer of cores of the waveguide.

The method 1000 includes optically coupling a light source to a first end of the waveguide, at 1004. The light source may be configured to provide a first light signal. In an embodiment, optically coupling the light to a first core of the waveguide may include using a flip chip process to mount the light source to a portion of the waveguide so that the first light signal provided by the light source is directed to a mirror of the waveguide associated with the first core. The mirror may reflect the first light signal so that the first light signal enters the first core and travels to a second end of the waveguide via the first core. In another embodiment, optically coupling the light source to the first core may include using a flip chip process to mount the light source to the substrate. The substrate may include one or more optical elements associated with the first core (e.g., a lens, lenses, light signal crosstalk inhibitors, collimators, etc.) that direct the first light signal provided by the light source to the mirror of the waveguide associated with the first core. The mirror may reflect the first light signal so that the first light signal enters the first core and travels to a second end of the waveguide via the first core.

The method 1000 includes optically coupling a first photodetector to a second core at the first end of the waveguide, at 1006. The first photodetector may be configured to receive a second light signal that exits the second core of the waveguide and produce an electrical signal corresponding to the second light signal. In an embodiment, optically coupling the first photodetector to the second core may include using a flip chip process to mount the photodetector to a portion of the waveguide so that the second light signal is reflected from the mirror of the waveguide associated with the second core to a photoreceptor of the second photodetector. In another embodiment, optically coupling the second photodetector to the second core may include using a flip chip process to mount the second photodetector to the substrate. The substrate may include one or more optical elements associated with the second core (e.g., a lens, lenses, light signal crosstalk inhibitors, collimators, etc.) that direct the second light reflected from the mirror associated with the second core to the photoreceptor.

The method 1000 includes coupling a logic driver to the substrate and electrically coupling the logic driver to the light source, at 1008. The flip chip process may be used to mount the logic driver to one or more conductive vias in the substrate, electrical traces that connect to the light source, or combinations thereof, to couple the logic driver to the substrate and electrically couple the logic driver to the light source.

The method 1000 includes coupling a first amplifier device to the substrate and electrically coupling the first amplifier device to the first photodetector, at 1010. The first amplifier device may be configured to amplify the electrical signal from the first photodetector (e.g., to generate an amplified signal). The flip chip process may be used to mount the first amplifier device to one or more conductive vias in the substrate, electrical traces that connect to the light source, or combinations thereof, to couple the logic driver to the substrate and electrically couple the logic driver to the light source. In some embodiments, a single flip chip process may be used to mount the logic driver and the first amplifier device when the logic driver and the first amplifier device are components of a single system-on-chip.

The method 1000 includes optically coupling a second photodetector to the first core at a second end of the waveguide, at 1012. The second photodetector may be configured to receive the first light signal from the first core and produce a second electrical signal corresponding to the first light signal. A second amplifier device may be coupled to the substrate and electrically coupled to the second photodetector, at 1014. The second amplifier device may be configured to receive and process the second electrical signal.

In an alternate embodiment, instead of optically coupling a second photodetector to the first core at a second end of the waveguide, the second end of the waveguide may be coupled to an optical device that is coupled to the substrate. The optical device may include an optical switch, a multiplexor, a demultiplexor, a modulator, or combinations thereof. The optical device may be configured to determine a destination for the first light signal. The optical device may also be configured to send the second light signal to the first photodetector via the second core of the waveguide.

The method 1000 enables simplified assembly of devices that utilize electro-optical communications. For example, by applying a waveguide to a first surface of a substrate of an electro-optical transceiver device, the first surface may form a cladding layer of the waveguide. Accordingly, the substrate may provide physical support for device components in addition to incorporating optical functionalities (e.g., by forming a cladding layer of the waveguide).

The method of FIG. 10 may be initiated or controlled by a field-programmable gate array (FPGA) device, an application-specific integrated circuit (ASIC), a processing unit such as a central processing unit (CPU), a digital signal processor (DSP), a controller, another hardware device, firmware device, or any combination thereof. As an example, the method 1000 of FIG. 10 may be performed by fabrication and/or assembly equipment including a processor that executes instructions stored at a memory (e.g., a non-transitory computer-readable medium), as described further with reference to FIG. 12.

Figure 11:
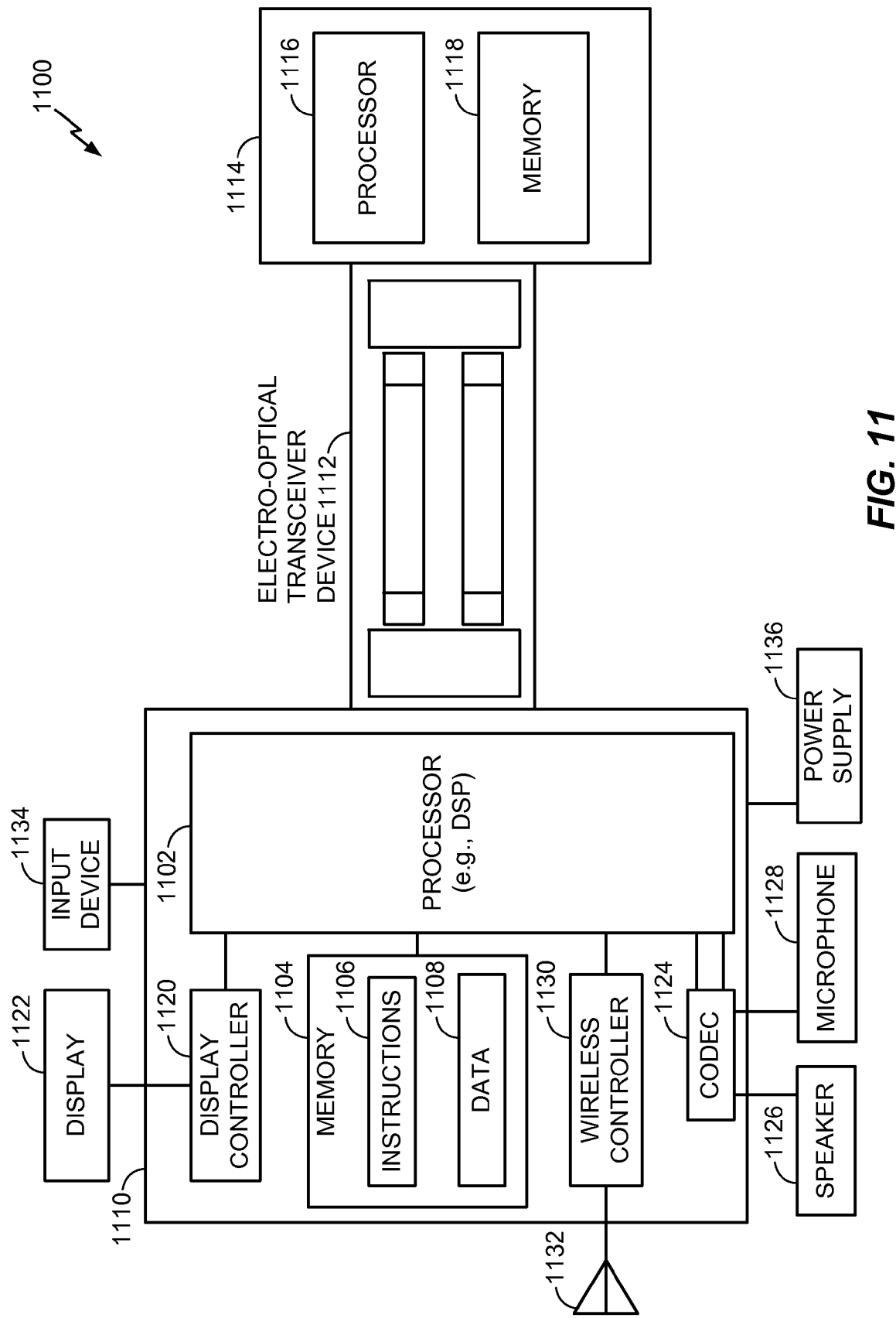
FIG. 11 is a block diagram of portable device including an electro-optical transceiver device.

Referring to FIG. 11, a block diagram of a particular illustrative embodiment of a wireless communication device is depicted and generally designated 1100. The device 1100 includes a processor 1102 (e.g., a digital signal processor (DSP)) coupled to a memory 1104 (e.g., a random access memory (RAM), flash memory, read-only memory (ROM), programmable read-only memory (PROM), erasable programmable read-only memory (EPROM), electrically erasable programmable read-only memory (EEPROM), registers, hard disk, a removable disk, a compact disc read-only memory (CD-ROM), or any other form of non-transient storage medium known in the art). The memory 1104 may store instructions 1106 executable by the processor 1102. The memory 1104 may store data 1108 accessible to the processor 1102. The processor 1102 and the memory 1104 may be included in a system-in-package or system-on-chip (SoC) 1110.

The device 1100 includes electro-optical transceiver device 1112 electrically coupled to portions of the device 1100 to communicatively couple the SoC 1110 to a second system-on-chip (SoC) 1114. The SoC 1114 may include a processor 1116 and a memory 1118. The memory 1118 may store data accessible to the processor 1116. The memory may also store instructions executable by the processor 1116 to perform operations.

The electro-optical transceiver device 1112 may receive first particular data as first electronic signals from the SoC 1110. The SoC 1114 is to receive the first particular data. A first portion of the electro-optical transceiver device 1112 associated with the SoC 1110 may convert the first electrical signals via a first logic driver and a first light source to first light signals corresponding to the first particular data. The first light signals are sent through one or more cores of a first waveguide to a second photodetector. The first waveguide may be coupled to a substrate of the electro-optical transceiver device 1112. The second photodetector converts the first light signals to the first particular data and sends the first particular data to an amplifier device that sends first amplified electrical signals corresponding to the first particular data to the SoC 1114. In a particular embodiment, the first waveguide may be coupled to a substrate of the electro-optical transceiver device 1112.

Similarly, the electro-optical transceiver device 1112 may receive second particular data as second electronic signals from the SoC 1114. The SoC 1110 is to receive the second particular data. A second portion of the electro-optical transceiver device 1112 associated with the SoC 1114 may convert the second electrical signals via a second logic driver and a second light source to second light signals corresponding to the second particular data. The second light signals are sent through one or more cores of a second waveguide to a first photodetector. The first photodetector converts the second light signals to the second particular data and sends the second particular data to an amplifier device that sends second amplified electrical signals corresponding to the second particular data to the SoC 1110.

As depicted in FIG. 11, the first waveguide and the second waveguide may be coupled to a substrate of the electro-optical transceiver device 1112. The electro-optical transceiver device 1112 may be any of the devices 400, 702, and 802 of FIGS. 4-8. In another embodiment, the first waveguide and the second waveguide may be waveguides of an optical circuit board electrically coupled to the SoC 1110 and the SoC 1114. A pair of electro-optical transceiver devices electrically coupled to the circuit board and optically coupled to the waveguides may communicatively couple the SoC 1110 and the SoC 1114. Each electro-optical transceiver device may correspond to the electro-optical transceiver device 102 of FIGS. 1 and 2. In a further embodiment, the electro-optical transceiver device 1112 may include an optical routing device. The electro-optical transceiver device 1112 may be the electro-optical transceiver device 900 of FIG. 9.

FIG. 11 also shows a display controller 1120 that is coupled to the digital signal processor 1102 and to a display 1122. A coder/decoder (CODEC) 1124 can also be coupled to the digital signal processor 1102. A speaker 1126 and a microphone 1128 can be coupled to the CODEC 1124. FIG. 11 also indicates that a wireless controller 1130 can be coupled to an antenna 1132 to control wireless communication by the device 1100.

In a particular embodiment, the wireless controller 1130, the display controller 1120, and the CODEC 1124 are also included in the system-in-package or system-on-chip 1110. In a particular embodiment, an input device 1134 and a power supply 1136 are coupled to the SoC 1110. Moreover, in a particular embodiment, as illustrated in FIG. 11, the display 1122, the input device 1134, the speaker 1126, the microphone 1128, the antenna 1132, and the power supply 1136 are external to the SoC 1110. However, each of the display 1122, the input device 1134, the speaker 1126, the microphone 1128, the antenna 1132, and the power supply 1136 can be coupled to a component of the SoC 1110, such as an interface or a controller.

Figure 12:
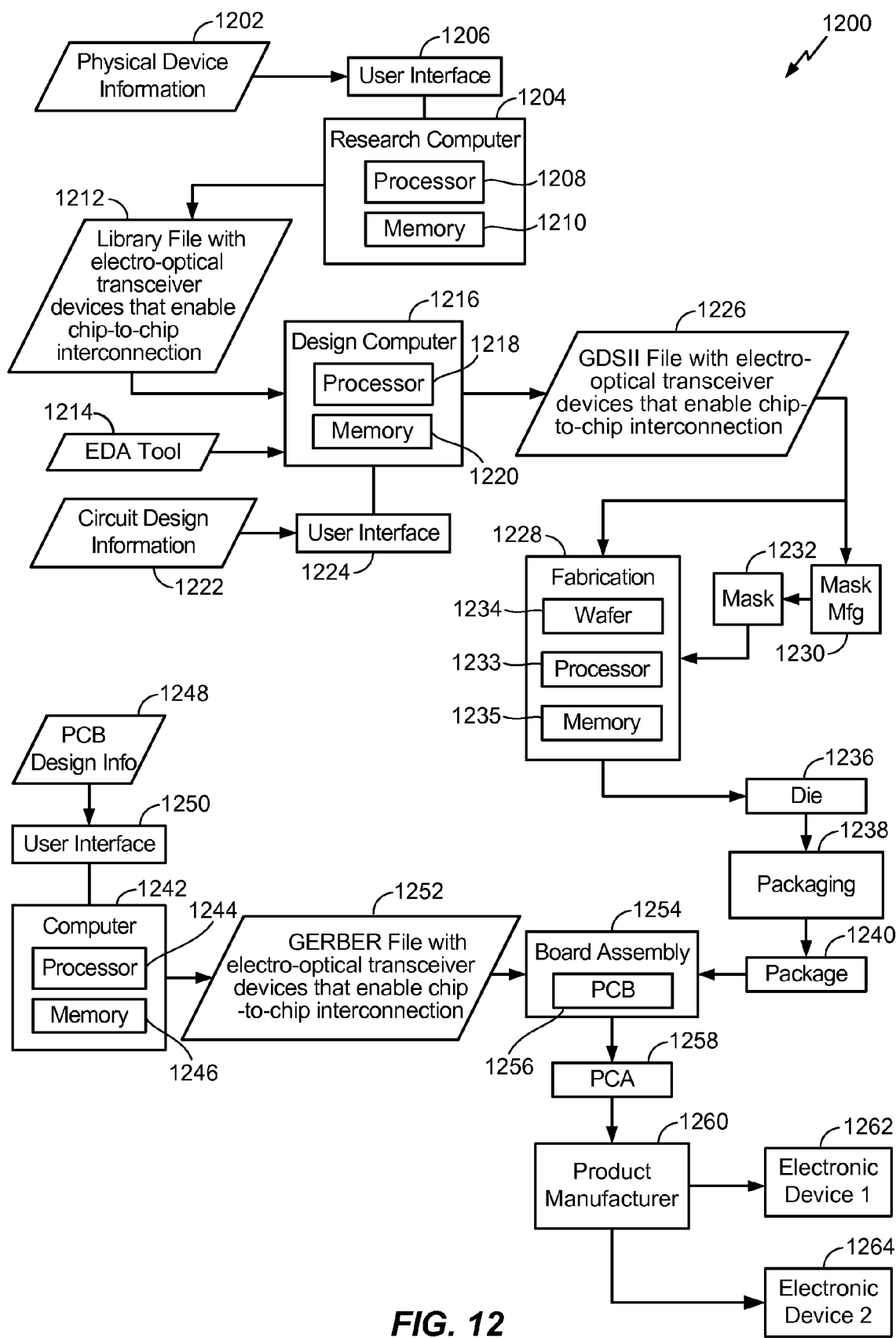
FIG. 12 is a data flow diagram of a particular illustrative embodiment of a manufacturing process to manufacture electronic devices that include an electro-optical transceiver device.

The foregoing disclosed devices and functionalities may be designed and configured as computer files (e.g. RTL, GDSII, GERBER, etc.) stored on computer readable media. Some or all such files may be provided to fabrication handlers who fabricate devices based on such files. Resulting products include semiconductor wafers that are then cut into semiconductor die and packaged into a semiconductor chip. The chips are then employed in devices described above. FIG. 12 depicts a particular illustrative embodiment of an electronic device manufacturing process 1200.

Referring to FIG. 12, a particular illustrative embodiment of an electronic device manufacturing process is depicted and generally designated 1200. In FIG. 12, physical device information 1202 is received at the manufacturing process 1200, such as at a research computer 1204. The physical device information 1202 may include design information representing at least one physical property of an electronic device, such as an electro-optical transceiver to enable chip-to-chip interconnection (e.g., the devices 400, 702, 802, 900 of FIGS. 4-9, a device formed according to the method 1000 of FIG. 10, or a combination thereof). For example, the physical device information 1202 may include physical parameters, material characteristics, and structure information that is entered via a user interface 1206 coupled to the research computer 1204. The research computer 1204 includes a processor 1208, such as one or more processing cores, coupled to a computer readable medium such as a memory 1210. The memory 1210 may store computer readable instructions that are executable to cause the processor 1208 to transform the physical device information 1202 to comply with a file format and to generate a library file 1212.

In a particular embodiment, the library file 1212 includes at least one data file including the transformed design information. For example, the library file 1212 may include a library of electro-optical transceiver devices that enable chip-to-chip interconnection (e.g., the devices 400, 702, 802, 900 of FIGS. 4-9, a device formed according to the method 1000 of FIG. 10, or a combination thereof) provided for use with an electronic design automation (EDA) tool 1214.

The library file 1212 may be used in conjunction with the EDA tool 1214 at a design computer 1216 including a processor 1218, such as one or more processing cores, coupled to a memory 1220. The EDA tool 1214 may be stored as processor executable instructions at the memory 1220 to enable a user of the design computer 1216 to design a circuit including the electro-optical transceiver device (e.g., the devices 400, 702, 802, 900 of FIGS. 4-9, a device formed according to the method 1000 of FIG. 10, or a combination thereof) of the library file 1212. For example, a user of the design computer 1216 may enter circuit design information 1222 via a user interface 1224 coupled to the design computer 1216. The circuit design information 1222 may include design information representing at least one physical property of a semiconductor device, such as the electro-optical transceiver device (e.g., the devices 400, 702, 802, 900 of FIGS. 4-9, a device formed according to the method 1000 of FIG. 10, or a combination thereof). To illustrate, the circuit design property may include identification of particular circuits and relationships to other elements in a circuit design, positioning information, feature size information, interconnection information, or other information representing a physical property of a semiconductor device.

The design computer 1216 may be configured to transform the design information, including the circuit design information 1222, to comply with a file format. To illustrate, the file formation may include a database binary file format representing planar geometric shapes, text labels, and other information about a circuit layout in a hierarchical format, such as a Graphic Data System (GDSII) file format. The design computer 1216 may be configured to generate a data file including the transformed design information, such as a GDSII file 1226 that includes information describing the electro-optical transceiver device (e.g., the devices 400, 702, 802, 900 of FIGS. 4-9, a device formed according to the method 1000 of FIG. 10, or a combination thereof), in addition to other circuits or information.

The GDSII file 1226 may be received at a fabrication process 1228 to manufacture the electro-optical transceiver device (e.g., the devices 400, 702, 802, 900 of FIGS. 4-9, a device formed according to the method 1000 of FIG. 10, or a combination thereof), according to transformed information in the GDSII file 1226. For example, a device manufacture process may include providing the GDSII file 1226 to a mask manufacturer 1230 to create one or more masks, such as masks to be used with photolithography processing, illustrated as a representative mask 1232. The mask 1232 may be used during the fabrication process to generate one or more wafers 1234, which may be tested and separated into dies, such as a representative die 1236. The die 1236 includes a circuit including the electro-optical transceiver device (e.g., the devices 400, 702, 802, 900 of FIGS. 4-9, a device formed according to the method 1000 of FIG. 10, or a combination thereof).

To further illustrate, a processor 1233 and a memory 1235 may initiate and/or control the fabrication process 1228. The memory 1235 may store executable instructions, such as computer-readable instructions or processor-readable instructions. The executable instructions may be executed by the processor 1233.

The fabrication process 1228 may be implemented by a fabrication system that is fully automated or partially automated. For example, the fabrication process 1228 may be automated according to a schedule. The fabrication system may include fabrication equipment (e.g., processing tools) to perform one or more operations to form a device, such as a semiconductor device. For example, the fabrication equipment may be configured to deposit one or more materials, epitaxially grow one or more materials, conformally deposit one or more materials, apply a hardmask, apply an etching mask, perform etching, perform planarization, and/or perform a wafer cleaning process, etc.

The fabrication system (e.g., an automated system that performs the fabrication process 1228) may have a distributed architecture (e.g., a hierarchy). For example, the fabrication system may include one or more processors, such as the processor 1233, one or more memories, such as the memory 1235, and/or one or more controllers that are distributed according to the distributed architecture. The distributed architecture may include a high-level processor that controls or initiates operations of one or more low-level systems. For example, a high-level processor may include one or more processors, such as the processor 1233, and the low-level systems may each include or may be controlled by one or more corresponding controllers. A particular controller of a particular low-level system may receive one or more instructions (e.g., commands) from a particular high-level system, may issue sub-commands to subordinate modules or process tools, and may communicate status data back to the particular high-level system. Each of the one or more low-level systems may be associated with one or more corresponding pieces of fabrication equipment (e.g., processing tools). In a particular embodiment, the fabrication system may include multiple processors that are distributed in the fabrication system. For example, a controller of a low-level system component may include a processor, such as the processor 1233.

Alternatively, the processor 1233 may be a part of a high-level system, subsystem, or component of the fabrication system. In another embodiment, the processor 1233 initiates or controls distributed processing operations associated with multiple levels and components of a fabrication system.

Thus, the processor 1233 may include processor-executable instructions that, when executed by the processor 1233, cause the processor 1233 to initiate or control formation of a device. The device may include one or more materials formed using one or more doping tools, such as a molecular beam epitaxial growth tool, a flowable chemical vapor deposition (FCVD) tool, a conformal deposition tool, and/or a spin-on deposition tool. During fabrication of the device, one or more materials may be removed (e.g., etched) from the device using one or more removal tools, such as a chemical removal tool, a reactive gas removal tool, a hydrogen reaction removal tool, a planarization tool, and/or a standard clean 1 type removal tool.

The processor 1233 may access instructions stored at the memory 1235 and may execute the instructions to initiate or control formation of a device or structure described herein. As an illustrative example, the processor 1233 may access instructions stored at the memory 1235 and may execute the instructions to initiate or control formation of the SoC 1110 and/or the SoC 1114.

The die 1236 may be provided to a packaging process 1238 where the die 1236 is incorporated into a representative package 1240. For example, the package 1240 may include the single die 1236 or multiple dies, such as a system-in-package (SiP) arrangement. The package 1240 may be configured to conform to one or more standards or specifications, such as Joint Electron Device Engineering Council (JEDEC) standards.

Information regarding the package 1240 may be distributed to various product designers, such as via a component library stored at a computer 1242. The computer 1242 may include a processor 1244, such as one or more processing cores, coupled to a memory 1246. A printed circuit board (PCB) tool may be stored as processor executable instructions at the memory 1246 to process PCB design information 1248 received from a user of the computer 1242 via a user interface 1250. The PCB design information 1248 may include physical positioning information of a packaged semiconductor device on a circuit board, the packaged semiconductor device corresponding to the package 1240 including the electro-optical transceiver device (e.g., the devices 400, 702, 802, 900 of FIGS. 4-9, a device formed according to the method 1000 of FIG. 10, or a combination thereof).

The computer 1242 may be configured to transform the PCB design information 1248 to generate a data file, such as a GERBER file 1252 with data that includes physical positioning information of a packaged semiconductor device on a circuit board, as well as layout of electrical connections such as traces and vias, where the packaged semiconductor device corresponds to the package 1240 including the electro-optical transceiver device (e.g., the devices 400, 702, 802, 900 of FIGS. 4-9, a device formed according to the method 1000 of FIG. 10, or a combination thereof). In other embodiments, the data file generated by the transformed PCB design information may have a format other than a GERBER format.

The GERBER file 1252 may be received at a board assembly process 1254 and used to create PCBs, such as a representative PCB 1256, manufactured in accordance with the design information stored within the GERBER file 1252. For example, the GERBER file 1252 may be uploaded to one or more machines to perform various steps of a PCB production process. The PCB 1256 may correspond to any of the circuit boards 104, 604, 704, 706, and 804. The PCB 1256 may be populated with electronic and/or optical components (e.g., one or more waveguides, electro-optical transceiver devices, SoCs, etc.) including the package 1240 to form a representative printed circuit assembly (PCA) 1258. In an illustrative embodiment, the assembly process 1254 performs one or more operations of the method 1000 of FIG. 10. One or more aspects of the assembly process 1254 may correspond to the fabrication process 1228 (e.g., the assembly process 1254 may be fully automated or partially automated and/or may include one or more high-level system components, one or more sub-system components, one or more processors or controllers, and/or one or more memories that store instructions, etc.).

The PCA 1258 may be received at a product manufacture process 1260 and integrated into one or more electronic devices, such as a first representative electronic device 1262 and a second representative electronic device 1264. As an illustrative, non-limiting example, the first representative electronic device 1262, the second representative electronic device 1264, or both, may be selected from the group of a set top box, a music player, a video player, an entertainment unit, a navigation device, a communications device, a personal digital assistant (PDA), a fixed location data unit, and a computer, into which the electro-optical transceiver device (e.g., the devices 400, 702, 802, 900 of FIGS. 4-9, a device formed according to the method 1000 of FIG. 10, or a combination thereof) is integrated. As another illustrative, non-limiting example, one or more of the electronic devices 1262 and 1264 may be remote units such as mobile phones, hand-held personal communication systems (PCS) units, portable data units such as personal data assistants, global positioning system (GPS) enabled devices, navigation devices, fixed location data units such as meter reading equipment, or any other device that stores or retrieves data or computer instructions, or any combination thereof. Although FIG. 12 illustrates remote units according to teachings of the disclosure, the disclosure is not limited to these illustrated units. Embodiments of the disclosure may be suitably employed in any device which includes active integrated circuitry including memory and on-chip circuitry.

A device that includes the electro-optical transceiver device (e.g., the devices 400, 702, 802, 900 of FIGS. 4-9, a device formed according to the method 1000 of FIG. 10, or a combination thereof), may be fabricated, processed, and incorporated into an electronic device, as described in the illustrative process 1200. One or more aspects of the embodiments disclosed with respect to FIGS. 4-9 may be included at various processing stages, such as within the library file 1212, the GDSII file 1226, and the GERBER file 1252, as well as stored at the memory 1210 of the research computer 1204, the memory 1220 of the design computer 1216, the memory 1246 of the computer 1242, the memory of one or more other computers or processors (not shown) used at the various stages, such as at the board assembly process 1254, and also incorporated into one or more other physical embodiments such as the mask 1232, the die 1236, the package 1240, the PCA 1258, other products such as prototype circuits or devices (not shown), or any combination thereof. Although various representative stages of production from a physical device design to a final product are depicted, in other embodiments fewer stages may be used or additional stages may be included. Similarly, the process 1200 may be performed by a single entity or by one or more entities performing various stages of the process 1200.

In conjunction with the described embodiments, an apparatus is disclosed that includes means for enabling electro-optical communications and means for guiding light. The apparatus further includes means for applying a light signal to the means for guiding light and means for controlling the means for applying the light signal. The means for guiding light is connected to a first surface of the means for coupling device components. The means for enabling electro-optical communications may include any of the substrates 106, 402, 710, 808, and 910 of FIGS. 1-9. The means for guiding light may include any of the waveguides 116, 408, 410, 712, 810, and 916 of FIGS. 1, 2, and 4-9. The means for applying the light signal may include the light sources 110, 412, 414, 718, 816, and 912 of FIGS. 1, 2, and 4-9. The means for controlling the means for applying the light signal may include the LD 108, which may be integrated within any of the SoCs 404, 406, 714, 716, 814, 816, and 902-908 of FIGS. 1, 2, and 4-9.

The apparatus may also include means for optical routing, means for signal processing, means for signal processing, and means for light signal detection. The means for optical routing may include one or more optical switches, multiplexors, demultiplexors, or combinations thereof, such as the optical routing device 918 of FIG. 9. The means for signal processing may include the amplifier device (AD), which may be integrated within any of the SoCs 404, 406, 714, 716, 814, 818, and 902-908 of FIGS. 1, 2, and 4-9. The means for light signal detection may include any of the photodetectors 114, 414, 416, 720, 812, and 914 of FIGS. 1, 2, and 4-9. The apparatus may further include a circuit board, such as any of the circuit boards 104, 604, 704, 706, and 804.

In conjunction with the described embodiments, a method of operating a device (e.g., a processor or a memory, as illustrative examples) is disclosed. The method may include sending a signal to a second device using a substrate, such as a glass interposer, that is coupled to the device. The substrate includes integrated components configured to enable simplified assembly and operation of electro-optical devices. For example, the substrate may include the lenses 204, the redistribution layers 302, the filled vias 304, one or more other integrated components, or a combination thereof. A waveguide may be connected to a first surface of the substrate, and the first surface may form a cladding layer of the substrate. Alternatively or in addition, a waveguide may be formed within (e.g., integrated within) the substrate. The substrate may correspond to any of the substrates 106, 402, 710, 808, and 910, and the waveguide may correspond to any of the waveguides 116, 408, 410, 712, 810, and 916. The signal may be sent using the LD 108 and the LS 110 of FIG. 1. The method may further include receiving a signal from a second device using the substrate. The signal may be received using the AD 112 and the PD 114 of FIG. 1. In a particular embodiment, the device is included in an electronic device (e.g., a server or a mobile device, etc.) that is assembled using the method 1000 of FIG. 10. The device may correspond to any of the SoCs 404, 406, 714, 716, 814, 816, and 902-908, as illustrative examples. The apparatus may further include a circuit board, such as any of the circuit boards 104, 604, 704, 706, and 804.

Those of skill would further appreciate that the various illustrative logical blocks, configurations, modules, circuits, and algorithm steps described in connection with the embodiments disclosed herein may be implemented as electronic hardware, computer software executed by a processor, or combinations of both. Various illustrative components, blocks, configurations, modules, circuits, and steps have been described above generally in terms of their functionality. Whether such functionality is implemented as hardware or processor executable instructions depends upon the particular application and design constraints imposed on the overall system. Skilled artisans may implement the described functionality in varying ways for each particular application, but such implementation decisions should not be interpreted as causing a departure from the scope of the present disclosure.

The steps of a method or algorithm described in connection with the embodiments disclosed herein may be embodied directly in hardware, in a software module executed by a processor, or in a combination of the two. A software module may reside in random access memory (RAM), flash memory, read-only memory (ROM), programmable read-only memory (PROM), erasable programmable read-only memory (EPROM), electrically erasable programmable read-only memory (EEPROM), registers, hard disk, a removable disk, a compact disc read-only memory (CD-ROM), or any other form of non-transient storage medium known in the art. An exemplary storage medium is coupled to the processor such that the processor can read information from, and write information to, the storage medium. In the alternative, the storage medium may be integral to the processor. The processor and the storage medium may reside in an application-specific integrated circuit (ASIC). The ASIC may reside in a computing device or a user terminal. In the alternative, the processor and the storage medium may reside as discrete components in a computing device or user terminal.

The previous description of the disclosed embodiments is provided to enable a person skilled in the art to make or use the disclosed embodiments. Various modifications to these embodiments will be readily apparent to those skilled in the art, and the principles defined herein may be applied to other embodiments without departing from the scope of the disclosure. Thus, the present disclosure is not intended to be limited to the embodiments shown herein but is to be accorded the widest scope possible consistent with the principles and novel features as defined by the following claims.

What is claimed is:

1. An apparatus comprising:
    a substrate;
    a waveguide coupled to a surface of the substrate, wherein the surface forms a cladding layer of the waveguide; and
    a photodetector configured to optically couple to an end of the waveguide, the photodetector configured to output an electrical signal responsive to receiving a light signal from a core of the waveguide.

2. The apparatus of claim 1, further comprising a circuit board, wherein the substrate and the waveguide are connected to the circuit board, and wherein the photodetector and the amplifier device are connected to the substrate.

3. The apparatus of claim 1, further comprising an optical routing device coupled to the substrate and configured to optically couple to the waveguide, wherein the optical routing device is configured to transmit the light signal through the core of the waveguide to the photodetector.

4. The apparatus of claim 1, wherein the substrate includes a transparent material, and wherein the substrate is configured to provide the light signal from the core to a photoreceptor of the photodetector.

5. The apparatus of claim 4, wherein the substrate includes a lens configured to focus the light signal and to provide the light signal to the photoreceptor.

6. The apparatus of claim 1, further comprising an amplifier device coupled to the substrate, wherein the amplifier device is electrically coupled to the photodetector to amplify the electrical signal to produce an amplified electrical signal, and wherein the substrate includes one or more traces configured to electrically couple the photodetector to the amplifier device.

7. A method comprising:
    applying a waveguide to a surface of a substrate of an electro-optical transceiver device, wherein the surface forms a cladding layer of the waveguide; and
    optically coupling a light source to an end of the waveguide.

8. The method of claim 7, further comprising electrically coupling a logic driver to a circuit board to enable the logic driver to receive data, power, or both via the circuit board.

9. The method of claim 7, further comprising:
    optically coupling a photodetector to a core at a second end of the waveguide, the photodetector configured to receive a light signal from the light source via the core and to produce an electrical signal corresponding to the light signal;
    coupling an amplifier device to the substrate; and
    electrically coupling the amplifier device to the photodetector, the amplifier device configured to receive and process the electrical signal.

10. The method of claim 7, further comprising:
    coupling a logic driver to the substrate; and
    electrically coupling the logic driver to the light source, the logic driver configured to control transmission of a light signal generated by the light source.

11. The method of claim 10, wherein the logic driver is included in a system-on-chip.

12. The method of claim 10, further comprising coupling an optical routing device to the substrate and to a second end of the waveguide.

13. The method of claim 12, wherein the optical routing device is configured to receive a light signal from the light source via a core of the waveguide.

14. The method of claim 10, wherein the logic driver is coupled to the surface of the substrate.

15. The method of claim 10, wherein logic driver is coupled to a second surface of the substrate opposite the surface, and wherein the logic driver is configured to electrically couple to the light source by a conductive via through the substrate.

16. The method of claim 7, wherein waveguide is a polymer waveguide, and wherein applying the waveguide and optically coupling the light source to the end of the waveguide are initiated or controlled by a processor executing instructions during an assembly process.

17. An apparatus comprising:
    means for enabling electro-optical communications;
    means for guiding light, wherein the means for guiding light is connected to a surface of the means for enabling electro-optical communications, and wherein the surface forms a cladding layer of the means for guiding light;
    means for applying a light signal to the means for guiding light; and
    means for controlling the means for applying the light signal, wherein the means for controlling electrically coupled to the means for applying the light signal.

18. The apparatus of claim 17, wherein the means for enabling electro-optical communications includes a substrate, and further comprising means for optical routing coupled to the substrate, wherein the means for optical routing is configured to direct the light signal to a destination device.

19. The apparatus of claim 17, further comprising means for signal processing, wherein the means for signal processing is electrically coupled to a means for light signal detection, the means for the lights signal detection configured to receive a second light signal via the means for guiding light and to generate an electrical signal corresponding to the second light signal.

20. The apparatus of claim 17, further comprising:
    means for signal processing coupled to the means for enabling electro-optical communications; and
    means for light signal detection electrically coupled to the means for signal processing and optically coupled to the means for guiding light, wherein the means for light signal detection is configured to receive the light signal via the means for guiding light and to send an electrical signal corresponding to the light signal to the means for signal processing.

21. The apparatus of claim 17, further comprising a circuit board, wherein the circuit board is coupled to the means for enabling electro-optical communications.

22. The apparatus of claim 21, further comprising a device selected from a server, a mobile phone, a communications device, a tablet, a navigation device, a personal digital assistant, a set top box, a music player, a video player, an entertainment unit, a fixed location data unit, and a computer, into which the circuit board is coupled.

23. A system comprising:

a substrate;

a light source array coupled to a surface of the substrate, the light source array configured to direct light signals via multiple pathways through the substrate to transmit cores of a waveguide;

a via between a pair of adjacent pathways to reduce crosstalk of light signals between the pair of adjacent pathways; and a logic driver configured to control the light source array, the logic driver coupled to the substrate and configured to electrically couple to the light source array.

24. The system of claim 23, wherein the substrate includes a lens array and wherein a subset of lenses of the lens array is configured to focus light signals from the light source array.

25. The system of claim 24, wherein a second subset of the lenses of the lens array is configured to focus second light signals from at least one reception core of the waveguide on at least one photodetector coupled to the substrate.

26. The system of claim 23, wherein the waveguide is coupled to a circuit board, and wherein the logic driver is coupled to the circuit board by one or more vias through the substrate.

27. The system of claim 23, wherein the waveguide is coupled to a second surface of the substrate.

28. The system of claim 27, further comprising an optical routing device coupled to the substrate and configured to optically couple to the waveguide, and wherein the optical routing device is configured to receive the light signals via one or more transmit cores of the waveguide.

29. The system of claim 23, further comprising:

a photodetector array coupled to the surface of the substrate and configured to optically couple to the waveguide, the photodetector array configured to receive second light signals from reception cores of the waveguide via multiple second pathways through the substrate and generate electrical signals corresponding to the second light signals;

a second via between a second pair of adjacent second pathways to reduce crosstalk of second light signals between the second pair of adjacent pathways; and an amplifier device configured to process the electrical signals received from the photodetector array, the amplifier device coupled to the substrate and electrically coupled to the photodetector array.

30. The system of claim 29, further comprising a third via between a pathway and a second pathway adjacent to the pathway to reduce crosstalk of light signals between the pathway and the second pathway.

* * * * *